United States Patent
Sato

(10) Patent No.: US 11,916,095 B2
(45) Date of Patent: Feb. 27, 2024

(54) IMAGING DEVICE AND METHOD OF MANUFACTURING IMAGING DEVICE

(71) Applicant: SONY SEMICONDUCTOR SOLUTIONS CORPORATION, Kanagawa (JP)

(72) Inventor: Naoyuki Sato, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 695 days.

(21) Appl. No.: 17/046,185

(22) PCT Filed: Mar. 1, 2019

(86) PCT No.: PCT/JP2019/008010
§ 371 (c)(1),
(2) Date: Oct. 8, 2020

(87) PCT Pub. No.: WO2019/202858
PCT Pub. Date: Oct. 24, 2019

(65) Prior Publication Data
US 2021/0175277 A1 Jun. 10, 2021

(30) Foreign Application Priority Data
Apr. 16, 2018 (JP) .................................. 2018-078118

(51) Int. Cl.
*H01L 27/148* (2006.01)
*H01L 27/146* (2006.01)

(52) U.S. Cl.
CPC .. *H01L 27/14812* (2013.01); *H01L 27/14698* (2013.01)

(58) Field of Classification Search
CPC .......................... H01L 27/14609; H04N 25/63
See application file for complete search history.

(56) References Cited

U.S. PATENT DOCUMENTS

| 7,354,789 B2 * | 4/2008 | Han ................... H01L 27/14689 438/57 |
| 7,423,305 B2 * | 9/2008 | Shinohara ......... H01L 27/14654 257/292 |

(Continued)

FOREIGN PATENT DOCUMENTS

| JP | 2002-164529 | 6/2002 |
| JP | 2013-033885 | 2/2013 |

(Continued)

OTHER PUBLICATIONS

International Search Report and Written Opinion prepared by the Japanese Patent Office dated May 14, 2019, for International Application No. PCT/JP2019/008010.

*Primary Examiner* — Jarrett J Stark
(74) *Attorney, Agent, or Firm* — SHERIDAN ROSS P.C.

(57) ABSTRACT

To increase the capacity of a charge holding section of a pixel in an imaging device that performs imaging using a global shutter method. An imaging device includes a photoelectric converter, a first charge holding section, an auxiliary charge holding section, a transfer route, and an image signal generator. The first charge holding section is formed near a front surface of a semiconductor substrate. A first charge transfer section transfers charge from the photoelectric converter to the first charge holding section. The auxiliary charge holding section underlies the first charge holding section, and holds a portion of the charges held in the first charge holding section. The transfer route transfers the charge between the first charge holding section and the auxiliary charge holding section. The image signal generator generates an image signal based on the charges held in the first charge holding section and the auxiliary charge holding section.

19 Claims, 10 Drawing Sheets

(56) References Cited

U.S. PATENT DOCUMENTS

| | | | |
|---|---|---|---|
| 7,763,913 B2 * | 7/2010 | Fan | H01L 27/14609 257/233 |
| 8,933,494 B1 | 1/2015 | Hu et al. | |
| 9,508,766 B2 * | 11/2016 | Noh | H01L 27/14616 |
| 10,818,708 B2 * | 10/2020 | Toyoguchi | H01L 27/14643 |
| 11,626,431 B2 * | 4/2023 | Shinohara | H01L 27/14612 348/302 |
| 2006/0284054 A1 * | 12/2006 | Asaba | H04N 25/63 250/214.1 |
| 2008/0135896 A1 * | 6/2008 | Fan | H01L 27/1463 257/292 |
| 2011/0226936 A1 * | 9/2011 | Pain | H01L 31/103 257/292 |
| 2013/0214129 A1 | 8/2013 | Kobayashi et al. | |
| 2014/0084143 A1 | 3/2014 | Sakano et al. | |
| 2014/0239430 A1 | 8/2014 | Egawa | |
| 2014/0252201 A1 * | 9/2014 | Li | H01L 27/14609 250/208.1 |
| 2015/0069471 A1 | 3/2015 | Kawamura | |
| 2015/0264244 A1 * | 9/2015 | Ichikawa | H04N 25/745 348/296 |
| 2016/0268322 A1 | 9/2016 | Watanabe et al. | |
| 2018/0026073 A1 * | 1/2018 | Tsuboi | H01L 27/14806 257/225 |
| 2018/0197910 A1 * | 7/2018 | Lee | H04N 25/771 |

FOREIGN PATENT DOCUMENTS

| | | |
|---|---|---|
| JP | 2013-172202 | 9/2013 |
| JP | 2014-165399 | 9/2014 |
| JP | 2015-053411 | 3/2015 |
| JP | 2015-082592 | 4/2015 |
| JP | 2017-147353 | 8/2017 |

* cited by examiner

IMAGING DEVICE AND METHOD OF MANUFACTURING IMAGING DEVICE

CROSS REFERENCE TO RELATED APPLICATIONS

This application is a national stage application under 35 U.S.C. 371 and claims the benefit of PCT Application No. PCT/JP2019/008010 having an international filing date of 1 Mar. 2019, which designated the United States, which PCT application claimed the benefit of Japanese Patent Application No. 2018-078118 filed 16 Apr. 2018, the entire disclosures of each of which are incorporated herein by reference.

TECHNICAL FIELD

The present disclosure relates to an imaging device and a method of manufacturing the imaging device. In particular, the present disclosure relates to an imaging device having a global shutter function and a method of manufacturing the imaging device.

BACKGROUND ART

The imaging device includes pixels arranged in a two-dimensional grid, each pixel generating an image signal. The pixel includes a photoelectric converter that performs photoelectric conversion on incident light and generates a charge depending on the incident light, and a pixel circuit that generates an image signal from the charge generated by the photoelectric converter. A rolling shutter method and a global shutter method are used as a method of performing imaging using such an imaging device. The rolling shutter method is a method of performing processing including exposure and generation of an image signal for each row of a plurality of pixels arranged in an imaging device in a sequential manner. Although it is possible to simplify the configuration of a pixel, there is a problem in which an image of a moving subject is distorted due to exposure being performed for each row during different periods.

On the other hand, the global shutter method is a method of performing exposure in all of the pixels arranged in an imaging device at the same time. A distortion in an image that is caused when the rolling shutter method is used is not caused, and thus it is possible to obtain a high-quality image. Note that, as in the case of the rolling shutter method, generation of an image signal after exposure is performed for each row in a sequential manner. Since the period from an end of exposure to generation of an image signal differs for each row, a holding section that temporarily holds a charge generated by the photoelectric converter upon performing exposure is arranged in a pixel. For example, an imaging device has been proposed that uses a photodiode as a photoelectric converter, starts performing exposure in all of the pixels at the same time, stops performing exposure in all of the pixels at the same time, and transfers a charge accumulated in the photodiode to a charge holding section to cause the charge holding section to hold the transferred charge (for example, refer to Patent Literature 1). The charge held in the charge holding section is read for each row in a sequential manner, and an image signal is generated and output.

CITATION LIST

Patent Literature

Patent Literature 1: WO2018/008614

DISCLOSURE OF INVENTION

Technical Problem

The related art described above has a problem in which the capacity of the charge holding section is insufficient. When the pixel size is reduced as a result of achieving a higher resolution of an imaging device, it will be difficult to secure a region for arranging the charge holding section. This results in being unable to apply the global shutter method.

The present disclosure has been achieved in view of the problems described above, and it is an object of the present disclosure to increase the capacity of a charge holding section of a pixel in an imaging device that performs imaging using the global shutter method.

Solution to Problem

The present disclosure has been achieved to solve the problems described above, and a first aspect of the present disclosure is an imaging device that includes a photoelectric converter that generates a charge depending on incident light; a first charge holding section that is formed near a front surface of a semiconductor substrate, and holds the charge; a first charge transfer section that transfers the charge from the photoelectric converter to the first charge holding section; an auxiliary charge holding section that is formed to underlie the first charge holding section in the semiconductor substrate, and holds a portion of the charges held in the first charge holding section; a transfer route that is a route used to transfer the charge between the first charge holding section and the auxiliary charge holding section; and an image signal generator that generates an image signal on the basis of the charges held in the first charge holding section and the auxiliary charge holding section.

Further, in the first aspect, the auxiliary charge holding section may have the same conductivity type as the first charge holding section, and a semiconductor region of a conductivity type different from the conductivity type of the first charge holding section may be arranged between the auxiliary charge holding section and the first charge holding section.

Further, in the first aspect, the transfer route may be formed of a semiconductor region of the same conductivity type as the first charge holding section and the auxiliary charge holding section.

Further, in the first aspect, the transfer route may be formed of a vertical gate electrode and the semiconductor substrate near the vertical gate electrode, the vertical gate electrode being arranged between the first charge holding section and the auxiliary charge holding section.

Further, in the first aspect, a second charge holding section that holds the charge, and a second charge transfer section that transfers the charge from the first charge holding section and the auxiliary charge holding section to the second charge holding section may be further included, and the image signal generator may generate an image signal on the basis of the charge held in the second charge holding section.

Further, a second aspect of the present disclosure is a method of manufacturing an imaging device, the method including forming an auxiliary charge holding section such that the auxiliary charge holding section underlies a first charge holding section in a semiconductor substrate, the first charge holding section holds a charge generated by a photoelectric converter that generates the charge depending on incident light, the auxiliary charge holding section holding a portion of the held charges; forming a transfer route that is a route used to transfer the charge between the first charge holding section and the auxiliary charge holding section; forming the first charge holding section in the semiconductor substrate; forming the photoelectric converter; forming a first charge transfer section that transfers the charge from the photoelectric converter to the first charge holding section; and forming an image signal generator that generates an image signal on the basis of the charges held in the first charge holding section and the auxiliary charge holding section.

A charge generated by the photoelectric converter is held in the auxiliary charge holding section in addition to the first charge holding section. Since the auxiliary charge holding section is arranged to underlie the first charge holding section, the capacity for holding a charge generated by the photoelectric converter is expected to be increased, and an increase in the footprint of a charge holding section is expected to be suppressed.

Advantageous Effects of Invention

The present disclosure provides an excellent effect of increasing the capacity of a charge holding section of a pixel in an imaging device that performs imaging using a global shutter method.

MODE(S) FOR CARRYING OUT THE INVENTION

Next, modes for carrying out the present disclosure (hereinafter referred to as embodiments) will be described with reference to the drawings. In the accompanying drawings, the same or similar portions will be denoted by the same or similar reference symbols. However, the figures are schematic ones, and, for example, a ratio of dimensions of respective components is not necessarily the same as the actual one. Further, of course, a certain figure and another figure have different dimensional relationships and different ratios of dimensions with respect to the same portion. Moreover, the embodiments will be described in the following order.

1. First Embodiment
2. Second Embodiment
3. Third Embodiment
4. Example of Application to Camera 1. First Embodiment

[Configuration of Imaging Device]

Figure 1:
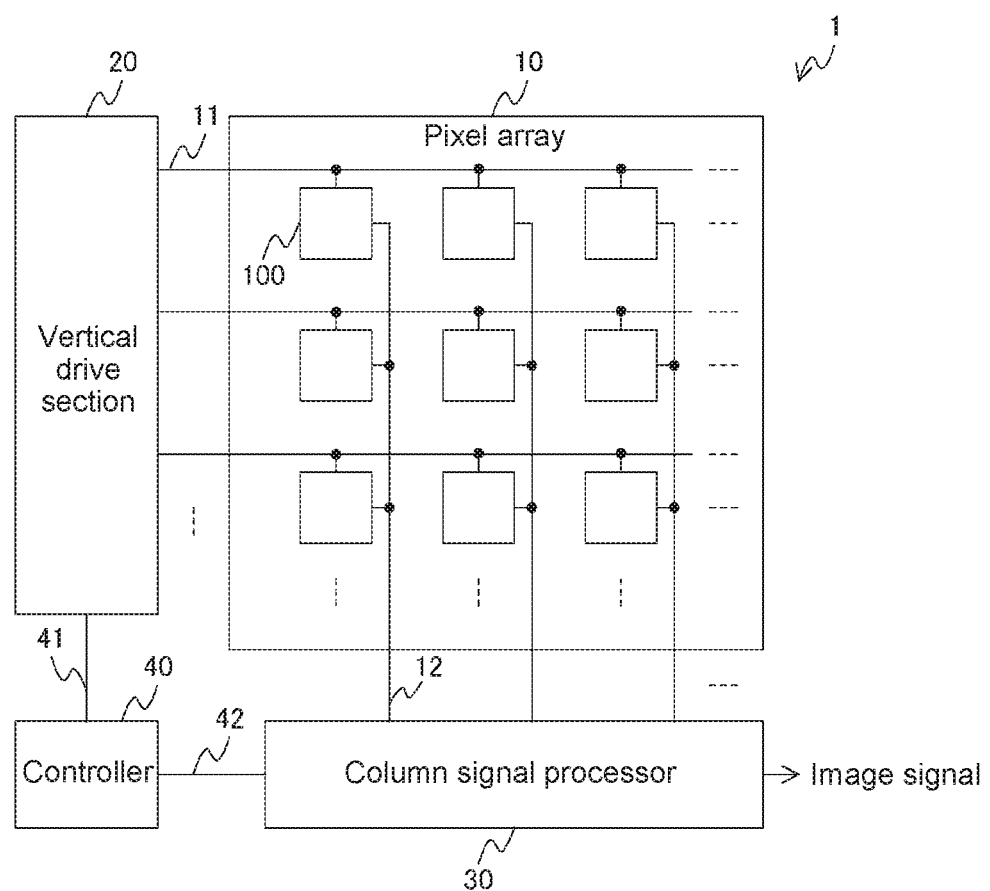
FIG. 1 illustrates a configuration example of an imaging device according to embodiments of the present disclosure.

FIG. 1 illustrates a configuration example of an imaging device according to embodiments of the present disclosure. An imaging device 1 in the figure includes a pixel array 10, a vertical drive section 20, a column signal processor 30, and a controller 40.

The pixel array 10 includes pixels 100 arranged in a two-dimensional grid. Here, the pixel 100 generates an image signal depending on irradiated light. The pixel 100 includes a photoelectric converter that generates a charge depending on irradiated light. The pixel 100 further includes a pixel circuit. The pixel circuit generates an image signal based on a charge generated by the photoelectric converter. The generation of an image signal is controlled by a control signal generated by the vertical drive section 20 described later. The pixel array 10 includes signal lines 11 and 12 arranged in an XY matrix. The signal line 11 is a signal line that transmits a control signal for the pixel circuit in the pixel 100. The signal line 11 is arranged for each row of the pixel array 10 and wired in common with respect to the pixels 100 arranged in each row. The signal line 12 is a signal line that transmits an image signal generated by the pixel circuit of the pixel 100. The signal line 12 is arranged for each column of the pixel array 10 and wired in common with respect to the pixels 100 arranged in each column. The photoelectric converter and the pixel circuit are formed in a semiconductor substrate.

The vertical drive section 20 generates a control signal for the pixel circuit of the pixel 100. The vertical drive section 20 transmits the generated control signal to the pixel 100 through the signal line 11 in the figure. The column signal processor 30 processes an image signal generated by the pixel 100. The column signal processor 30 processes the image signal transmitted from the pixel 100 through the signal line 12 in the figure. The processing performed by the column signal processor 30 corresponds to, for example, an analog-to-digital conversion that converts an analog image signal generated in the pixel 100 into a digital image signal. The image signal processed by the column signal processor 30 is output as an image signal of the imaging device 1. The controller 40 controls the entire imaging device 1. The controller 40 controls the imaging device 1 by generating and outputting a control signal used to control the vertical drive section 20 and the column signal processor 30. The control signal generated by the controller 40 is transmitted to the vertical drive section 20 and the column signal processor 30 respectively through signal lines 41 and 42.

[Configuration of Pixel]

Figure 2:
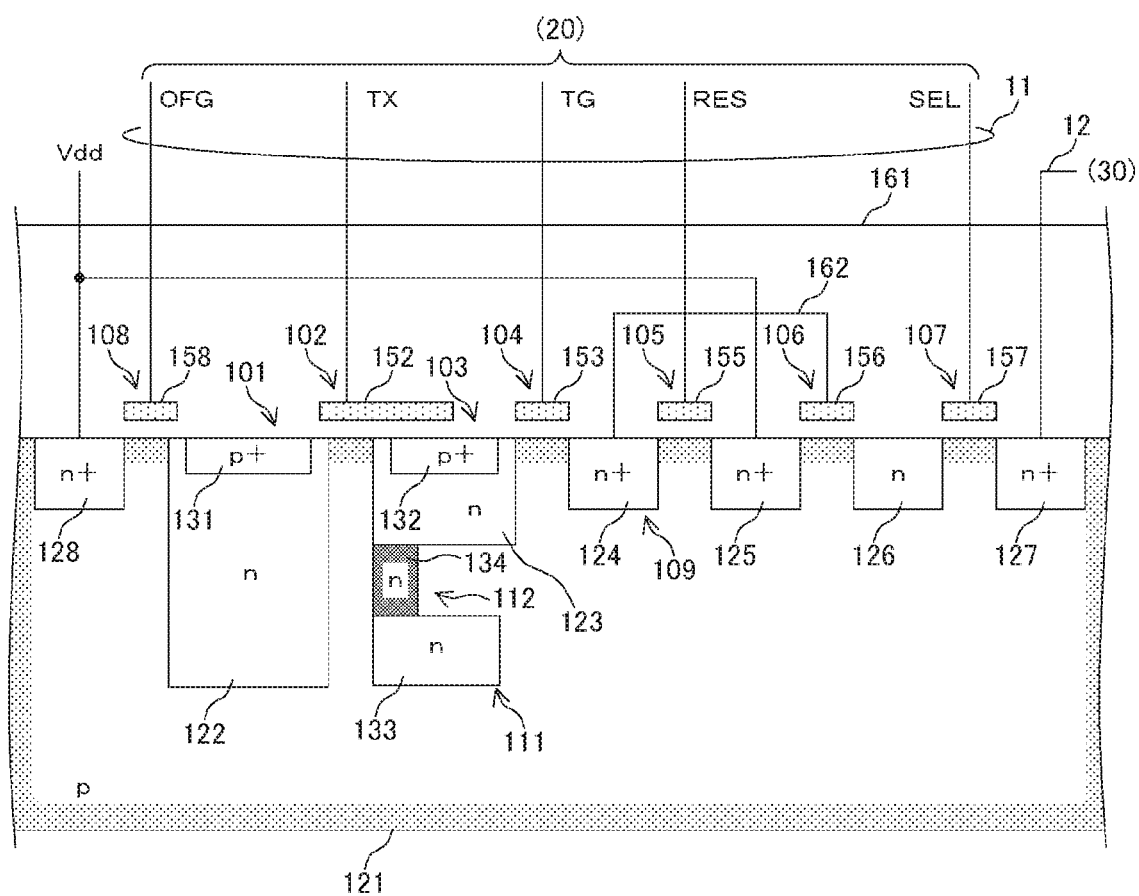
FIG. 2 illustrates a configuration example of a pixel according to a first embodiment of the present disclosure.

FIG. 2 illustrates a configuration example of a pixel according to a first embodiment of the present disclosure. The figure is a schematic cross-sectional view illustrating a configuration example of a pixel 100 formed in a semiconductor substrate 121. The pixel 100 includes a photoelectric converter 101, a first charge transfer section 102, a first charge holding section 103, a second charge transfer section 104, a second charge holding section 109, an auxiliary charge holding section 111, a transfer route 112, and a charge draining section 108. The pixel 100 further includes MOS transistors 105, 106, and 107. Note that the MOS transistors 106 and 107 make up an image signal generator.

The semiconductor substrate 121 is a semiconductor substrate in which a semiconductor region of an element arranged in the pixel 100 is formed. For example, a p-type well region is formed in the semiconductor substrate 121, and a semiconductor region of an element is formed in the p-type well region. For convenience, the semiconductor substrate 121 in the figure is assumed to be formed as a p-type well region. An insulation layer 161 is arranged on a front surface of the semiconductor substrate 121. A wiring layer is arranged in the insulation layer 161, and includes wiring used to establish an electrical connection between elements formed in the semiconductor substrate 121, and a signal line that transmits a signal.

The signal lines 11 and 12 described with reference to FIG. 1 are arranged for the pixel 100 in the figure. The signal line 11 includes a signal line OFG, a signal line TX, a signal line TG, a signal line RES, and a signal line SEL. The signal line OFG, the signal line TX, the signal line TG, the signal line RES, and the signal line SEL are respectively connected to gates of the charge draining section 108, the first charge transfer section 102, the second charge transfer section 104, the MOS transistor 105, and the MOS transistor 107, and transmit a control signal. Further, a power supply line Vdd is connected to the pixel 100. The power supply line Vdd is wiring that supplies power to the pixel circuit of the pixel 100.

The photoelectric converter 101 performs photoelectric conversion depending on incident light. The photoelectric converter 101 is formed of an n-type semiconductor region 122 and a p-type well region surrounding the n-type semiconductor region 122. A photodiode is formed of a p-n junction that is an interface between the n-type semiconductor region 122 and the p-type well region, and photoelectric conversion is performed. An electron from among a charge generated by the photoelectric conversion during an exposure period is held in the n-type semiconductor region 122. Note that a p-type semiconductor region 131 is arranged on the surface of the n-type semiconductor region 122. The p-type semiconductor region 131 is used to perform pinning on a surface level of the n-type semiconductor region 122. This makes it possible to reduce a dark current.

The first charge holding section 103 holds a charge generated by the photoelectric converter 101. The first charge holding section 103 is formed of an n-type semiconductor region 123. The n-type semiconductor region 123 may exhibit an impurity concentration higher than that of the n-type semiconductor region 122. A p-type semiconductor region 132 used to perform pinning is arranged on the surface of the n-type semiconductor region 123.

The auxiliary charge holding section 111 holds a portion of charges held in the first charge holding section 103. The auxiliary charge holding section 111 is formed of an n-type semiconductor region 133. The n-type semiconductor region 133 is arranged to underlie the n-type semiconductor region 123 described above in the semiconductor substrate 121. Further, a p-type semiconductor region may be arranged between the n-type semiconductor region 123 and the n-type semiconductor region 133. This makes it possible to separate the first charge holding section 103 and the auxiliary charge holding section 111. In the figure, a p-type well region is arranged between the n-type semiconductor region 123 and the n-type semiconductor region 133. The n-type semiconductor region 133 may exhibit the same impurity concentration as the n-type semiconductor region 123. The arrangement of the auxiliary charge holding section 111 makes it possible to increase the capacity for holding a charge generated by the photoelectric converter 101.

The transfer route 112 is a route used to transfer a charge between the first charge holding section 103 and the auxiliary charge holding section 111. The transfer route 112 in the figure is formed of an n-type semiconductor region 134 formed between the n-type semiconductor region 123 and the n-type semiconductor region 133. A charge transferred by the first charge transfer section 102 can move bidirectionally between the first charge holding section 103 and the auxiliary charge holding section 111 via the transfer route 112.

The first charge transfer section 102 is a transistor that transfers a charge generated by the photoelectric converter 101 to the first charge holding section 103. The first charge transfer section 102 is a MOS transistor in which the n-type semiconductor region 122 and the n-type semiconductor region 123 are a source and a drain, respectively, and the p-type well region between the n-type semiconductor region 122 and the n-type semiconductor region 123 is a channel region. A gate 152 is arranged in the first charge transfer section 102. The gate 152 is arranged over the surface of a region from the channel region between the n-type semiconductor region 122 and the n-type semiconductor region 123 to a portion of the n-type semiconductor region 123. The signal line TX is connected to the gate 152. Note that the insulation layer 161 between the gate 152 and the semiconductor substrate 121 corresponds to a gate oxide film.

A voltage greater than a threshold voltage of a MOS transistor (hereinafter referred to as an ON-voltage) is applied through the signal line TX, conduction is provided between the n-type semiconductor regions 122 and 123, and a charge is transferred. Specifically, when the ON-voltage is applied to the gate 152, potentials of the channel region and the n-type semiconductor region 123 become deeper than a potential of the n-type semiconductor region 122, and a charge held in the n-type semiconductor region 122 is moved to the n-type semiconductor region 123. Accordingly, a complete transfer in which all of the charges generated by the photoelectric converter 101 are transferred to the first charge holding section 103, is performed.

The second charge holding section 109 holds charges transferred from the first charge holding section 103 and the auxiliary charge holding section 111. The second charge holding section 109 is formed of an n-type semiconductor region 124. The n-type semiconductor region 124 corresponds to a floating diffusion region in which charge-voltage conversion is performed. Note that the n-type semiconductor region 124 may exhibit an impurity concentration higher than that of the n-type semiconductor region 123. It is possible to perform a complete transfer when the second charge transfer section 104 described later transfers a charge held in the first charge holding section 103 to the second charge holding section 109.

The second charge transfer section 104 is a transistor that transfers a charge held in the first charge holding section 103 to the second charge holding section 109. The second charge transfer section 104 is a MOS transistor in which the n-type semiconductor region 123 and the n-type semiconductor region 124 are a source and a drain, respectively, and a p-type well region between the n-type semiconductor regions 123 and 124 is a channel region. A gate 153 is arranged in the second charge transfer section 104, and the signal line TG is connected to the gate 153. When an ON-voltage is applied through the signal line TG, conduction is provided between the n-type semiconductor regions 123 and 124, and a charge is transferred. As described above, the auxiliary charge holding section 111 is connected to the first charge holding section 103 via the transfer route 112. Thus, the second charge transfer section 104 further transfers a charge held in the auxiliary charge holding section 111 to the second charge holding section 109.

The MOS transistor 105 is a MOS transistor that resets the second charge holding section 109. The MOS transistor 105 is a MOS transistor in which the n-type semiconductor region 124 and an n-type semiconductor region 125 are a source and a drain, respectively, and a p-type well region between the n-type semiconductor regions 124 and 125 is a channel region. Further, a gate 155 is arranged in the MOS transistor 105, and the signal line RES is connected to the gate 155. Furthermore, the power supply line Vdd is connected to the n-type semiconductor region 125. It is possible to perform the reset by the MOS transistor 105 by draining a charge held in the second charge holding section 109 to the power supply line Vdd. Specifically, when an ON-voltage is applied through the signal line RES, conduction is provided between the n-type semiconductor regions 124 and 125, and a charge held in the n-type semiconductor region 124 is moved to a power supply through the power supply line Vdd. This makes it possible to perform the reset. At this point, it is possible to further reset the first charge holding section 103 and the auxiliary charge holding section 111 by bring the second charge transfer section 104 into conduction.

The MOS transistor 106 is a transistor that generates an image signal depending on a charge held in the second charge holding section 109. The MOS transistor 106 is a MOS transistor in which the n-type semiconductor region 125 and an n-type semiconductor region 126 are a drain and a source, respectively, and a p-type well region between the n-type semiconductor regions 125 and 126 is a channel region. Further, a gate 156 is arranged in the MOS transistor 106. As described above, the power supply line Vdd is connected to the drain, and the gate 156 is connected to the n-type semiconductor region 124 via wiring 162. Thus, the MOS transistor 106 generates an image signal of a voltage depending on a charge held in the second charge holding section 109. It is possible to take the generated image signal from the n-type semiconductor region 126 that is the source of the MOS transistor 106.

The MOS transistor 107 is a transistor that outputs an image signal generated by the MOS transistor 106 from the pixel 100. The MOS transistor 107 is a MOS transistor in which the n-type semiconductor region 126 and an n-type semiconductor region 127 are a drain and a source, respectively, and a p-type well region between the n-type semiconductor regions 126 and 127 is a channel region. Further, a gate 157 is arranged in the MOS transistor 107, and the signal line SEL is connected to the gate 157. Further, the signal line 12 is connected to the n-type semiconductor region 127. When an ON-voltage is applied through the signal line SEL, conduction is provided between the n-type semiconductor regions 126 and 127, and the image signal generated by the MOS transistor 106 is output to the signal line 12.

The charge draining section 108 is a transistor that resets the photoelectric converter 101 by draining a charge held in the photoelectric converter 101 to the power supply line Vdd. The charge draining section 108 is a MOS transistor in which the n-type semiconductor region 122 and an n-type semiconductor region 128 are a source and a drain, respectively, and a p-type well region between the n-type semiconductor regions 122 and 128 is a channel region. Further, a gate 158 is arranged in the charge draining section 108, and the signal line OFG is connected to the gate 158. Furthermore, the power supply line Vdd is connected to the n-type semiconductor region 128. When an ON-voltage is applied through the signal line OFG, conduction is provided between the n-type semiconductor regions 122 and 128, and a charge held in the n-type semiconductor region 122 is moved to the power supply through the power supply line Vdd. This makes it possible to perform the reset. In addition, the charge draining section 108 further drains a charge excessively generated by the photoelectric converter 101 during an exposure period. This makes it possible to prevent the occurrence of blooming.

Generation of an image signal in the pixel 100 in the figure can be performed by a procedure indicated below. First, an ON-signal is applied to the signal line OFG to bring the charge draining section 108 into conduction, and the photoelectric converter 101 is reset. Exposure starts to be performed after the reset, and a charge is accumulated in the n-type semiconductor region 122 of the photoelectric converter 101. After a lapse of a specified exposure period, an ON-voltage is applied to the signal line TG and the signal line RES to reset the first charge holding section 103 and the auxiliary charge holding section 111. Next, an ON-voltage is applied to the signal line TX to bring the first charge transfer section 102 into conduction, and a charge generated by the photoelectric converter 101 is transferred to the first charge holding section 103. At this point, a charge is also transferred to the auxiliary charge holding section 111. The processing from the reset of the photoelectric converter 101 to the transfer of a charge that is performed by the first charge transfer section 102 is performed in all of the pixels 100 at the same time.

Next, an ON-voltage is applied to the signal line RES to bring the MOS transistor 105 into conduction, and the second charge holding section 109 is reset. Next, an ON-voltage is applied to the signal line TG to bring the second charge transfer section 104 into conduction, and charges held in the first charge holding section 103 and the auxiliary charge holding section 111 are transferred to the second charge holding section 109. This results in an image signal being generated by the MOS transistor 106. Next, an ON-voltage is applied to the signal line SEL to bring the MOS transistor 107 into conduction, and the image signal is output. The processing from the reset of the second charge holding section 109 to the output of an image signal is performed for each row in a sequential manner. The procedure described above makes it possible to perform imaging using a global shutter method.

The imaging device 1 may be formed as a frontside-irradiation imaging device in which light from a subject is irradiated onto the photoelectric converter 101 from the front surface (a surface on which the insulation layer 161 and wiring are formed) of the semiconductor substrate 121 in the pixel 100 in the figure. Further, the imaging device 1 may also be formed as a backside-irradiation imaging device in which light from a subject is irradiated onto the photoelectric converter 101 from the back surface of the semiconductor substrate 121.

Note that the configuration of the imaging device 1 is not limited to this example. For example, the imaging device 1 may include a plurality of auxiliary charge holding sections. It is also possible to provide a plurality of auxiliary charge holding sections in a multi-layer arrangement.

[Planar Configuration of Pixel]

Figure 3:
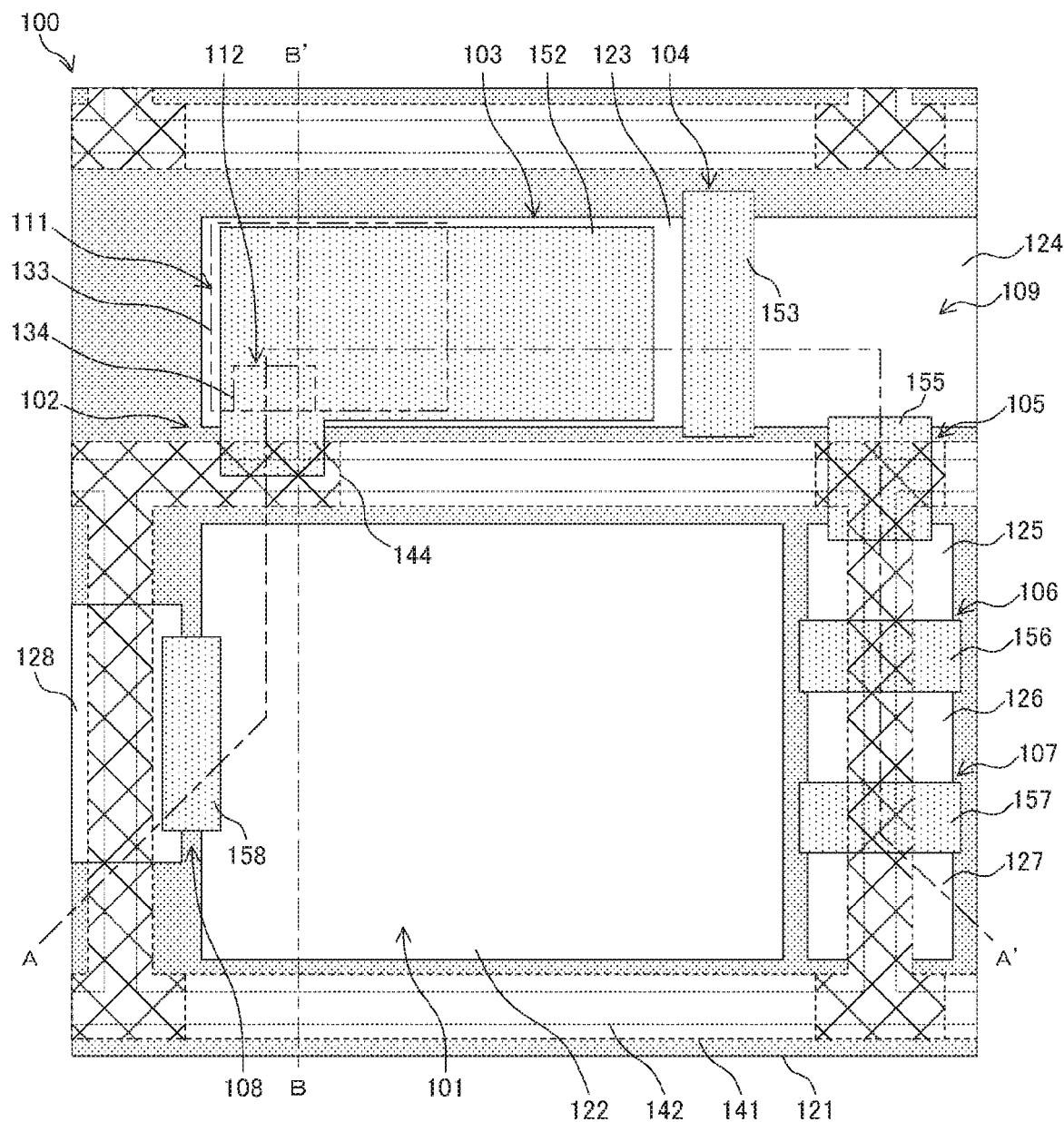
FIG. 3 is a plan view illustrating a configuration example of the pixel according to the first embodiment of the present disclosure.

FIG. 3 is a plan view illustrating a configuration example of the pixel according to the first embodiment of the present disclosure. The figure is a plan view illustrating a configuration example of the pixel 100 as viewed from the front surface of the semiconductor substrate 121. The figure illustrates an example of the imaging device 1 of a backside-illumination type. The pixel 100 in the figure includes the photoelectric converter 101, the first charge transfer section 102, the first charge holding section 103, the second charge transfer section 104, the second charge holding section 109, the auxiliary charge holding section 111, the transfer route 112, and the charge draining section 108 that are described with reference to FIG. 2. The pixel 100 in the figure further includes the MOS transistors 105, 106, and 107. Note that FIG. 2 corresponds to a cross-sectional view that is taken along the line A-A' of FIG. 3 and schematically illustrates the configuration of the pixel 100. Note that descriptions of the p-type semiconductor regions 131 and 132 are omitted in the figure.

Further, the pixel 100 in the figure includes a separation region 141 and a light-blocking film 142. A dotted line and a dashed line in the figure respectively indicate the separation region 141 and the light-blocking film 142. The separation region 141 prevents the movement of a charge between the photoelectric converter 101 and the first charge holding section 103 and between the photoelectric converter 101 and the second charge holding section 109. The light-blocking film 142 is arranged inside the separation region 141, and shields the photoelectric converter 101 and the first charge holding section 103 from light. The separation region 141 and the light-blocking film 142 are also arranged in a space between the pixel 100 and an adjacent pixel 100. A region in the form of a net from among the separation region 141 represents an opening formed near the front surface of the semiconductor substrate 121. A portion of the separation region 141 that is other than the region in the form of a net is arranged to pass through the semiconductor substrate 121. The configurations of the separation region 141 and the light-blocking film 142 will be described later in detail.

The n-type semiconductor region 122 of the photoelectric converter 101 is arranged in a lower portion of the pixel 100 in the figure, and the gate 158 and the n-type semiconductor region 128 of the charge draining section 108 are arranged on the left of the n-type semiconductor region 122 in this order. The N-type semiconductor region 123 of the first charge holding section 103 is arranged in an upper portion of the pixel 100 in the figure. Further, the first charge transfer section 102 is arranged near an opening 144 of the separation region 141 in an upper left corner of the n-type semiconductor region 122. The gate 152 of the first charge transfer section 102 is arranged such that the gate 152 overlaps the n-type semiconductor region 123 in addition to being situated near the opening 144.

Further, the n-type semiconductor region 133 of the auxiliary charge holding section 111 and the n-type semiconductor region 134 of the transfer route 112 are arranged to underlie the n-type semiconductor region 123. A dot-dot-dash line in the figure indicates the n-type semiconductor region 133 and the transfer route 112. The gate 153 of the second charge transfer section 104 and the n-type semiconductor region 124 of the second charge holding section 109 are arranged on the right of the N-type semiconductor region 123 in this order. The gate 155 of the MOS transistor 105, the n-type semiconductor region 125, the gate 156 of the MOS transistor 106, the n-type semiconductor region 126, the gate 157 of the MOS transistor 107, and the n-type semiconductor region 127 are arranged under the n-type semiconductor region 124 in this order. Note that the n-type semiconductor region 128 of the charge draining section 108, the second charge holding section 109, and the MOS transistors 105, 106, and 107 are shared with an adjacent pixel 100.

[Configuration of Cross Section of Pixel]

Figure 4:
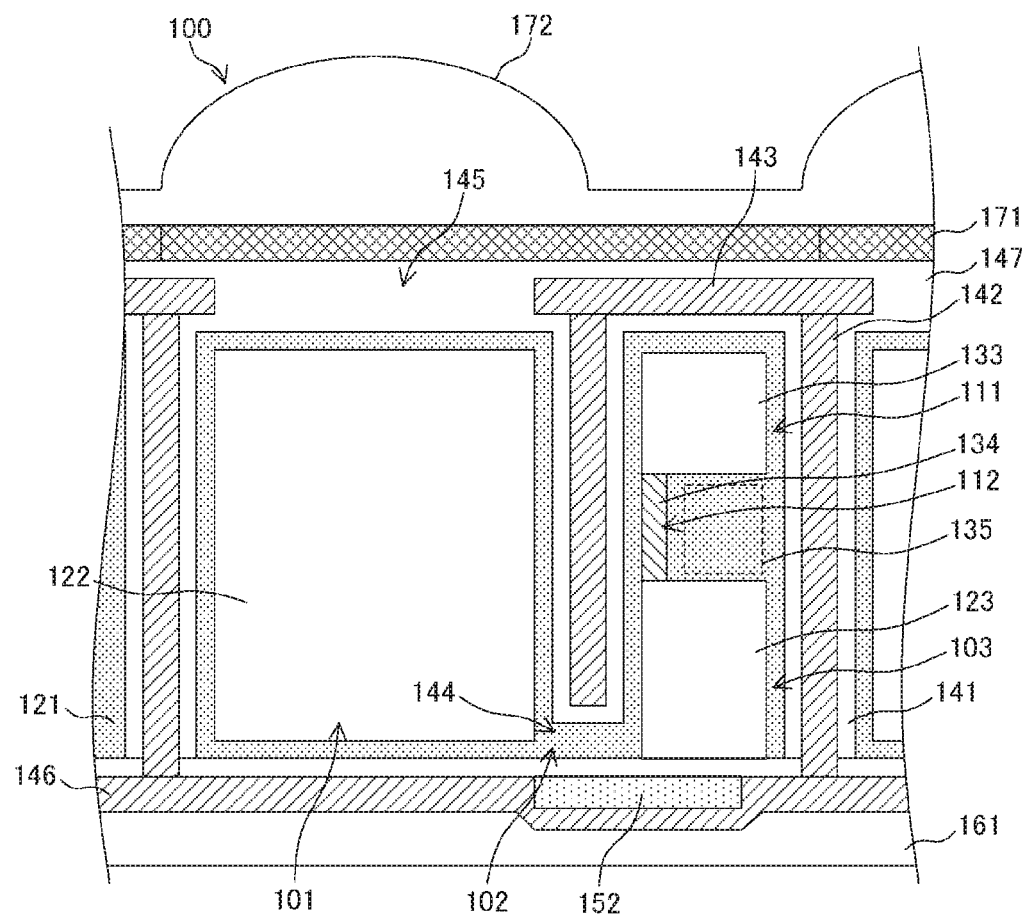
FIG. 4 is a cross-sectional view illustrating a configuration example of the pixel according to the first embodiment of the present disclosure.

FIG. 4 is a cross-sectional view illustrating a configuration example of the pixel according to the first embodiment of the present disclosure. The figure illustrates a cross section of the pixel 100 along the line B-B' of FIG. 3. The figure illustrates an example of the pixel 100 included in a backside-irradiation imaging device, and corresponds to a diagram obtained by turning the pixel 100 of FIG. 2 upside down. The figure illustrates the pixel 100 including the photoelectric converter 101, the first charge transfer section 102, the first charge holding section 103, the auxiliary charge holding section 111, and the transfer route 112. The pixel 100 in the figure further includes light-blocking films 143 and 146, an insulation film 147, a color filter 171, and an on-chip lens 172. Note that descriptions of the p-type semiconductor regions 131 and 132 are also omitted in the figure.

The on-chip lens 172 is a lens that collects incident light. The on-chip lens 172 collects light from a subject into the n-type semiconductor region 122 of the photoelectric converter 101.

The color filter 171 is an optical filter through which light of a specified wavelength from among incident light collected by the on-chip lens 172 is transmitted. Color filters through which red light, green light, and blue light are respectively transmitted can be used as the color filter 171.

The insulation film 147 is a film that insulates the side of the back surface of the semiconductor substrate 121. The insulation film 147 may be made of, for example, silicon oxide (SiO2). Further, the insulation film 147 in the figure is formed integrally with the separation region 141.

The light-blocking film 143 blocks incident light. The light-blocking film 143 is embedded to be arranged in a region of the insulation film 147, and blocks incident light from entering the first charge holding section 103. When the incident light is irradiated onto the n-type semiconductor region 123 of the first charge holding section 103, photoelectric conversion is performed in the n-type semiconductor region 123. When a charge generated by the photoelectric conversion is superimposed on a charge generated by the photoelectric converter 101, an error occurs in an image signal. The light-blocking film 143 prevents the occurrence of such an error. Further, an opening 145 is formed in the light-blocking film 143. The on-chip lens 172 collects incident light through the opening 145. The light-blocking film 143 may be made of, for example, metal such as tungsten (W).

The light-blocking film 146 is arranged on the surfaces of a gate oxide film from among the insulation layer 161 and the gate 152, and blocks incident light. The light-blocking film 146 blocks incident light transmitted through the photoelectric converter 101. When the incident light transmitted through the photoelectric converter 101 is reflected off the wiring layer and the like to become stray light, and the stray light enters another pixel 100, this results in crosstalk. The arrangement of the light-blocking film 146 makes it possible to prevent crosstalk. The light-blocking film 146 may also be made of metal such as W.

As described with reference to FIG. 3, the light-blocking film 142 blocks light from entering, for example, the first charge holding section 103 from the photoelectric converter 101. As illustrated in the figure, the opening 144 is formed in a portion, in the light-blocking film 142, in which the first charge transfer section 102 is arranged, and a channel region is secured. The other portion of the light-blocking film 142 is formed to pass through the semiconductor substrate 121, and arranged adjacent to the light-blocking films 143 and 146. This results in blocking incident light from entering the first charge holding section 103.

As illustrated in the figure, the n-type semiconductor region 133 of the auxiliary charge holding section 111 is arranged to underlie the n-type semiconductor region 123 of the first charge holding section 103 (in an upper portion of the figure), and the n-type semiconductor region 134 of the transfer route 112 is arranged to connect the n-type semiconductor region 133 of the auxiliary charge holding section 111 and the n-type semiconductor region 123 of the first charge holding section 103. By arranging the auxiliary charge holding section 111 to underlie the first charge holding section 103 in the semiconductor substrate 121, it is possible to increase the capacity for holding a charge generated by the photoelectric converter 101 without increasing the footprint of the first charge holding section 103 in the pixel 100.

As described above, the n-type semiconductor regions 123 and 133 each exhibit an impurity concentration higher than that of the n-type semiconductor region 122. The separate formation of the n-type semiconductor regions 123 and 133 makes it possible to simply form an n-type semiconductor region of a large amount of dose.

Note that, as illustrated in the figure, a p-type semiconductor region 135 exhibiting an impurity concentration higher than that of a p-type well region may be arranged between the n-type semiconductor regions 123 and 133.

Note that the configuration of the imaging device 1 is not limited to this example. For example, the light-blocking film 142 and the like may be omitted.

Figure 5:
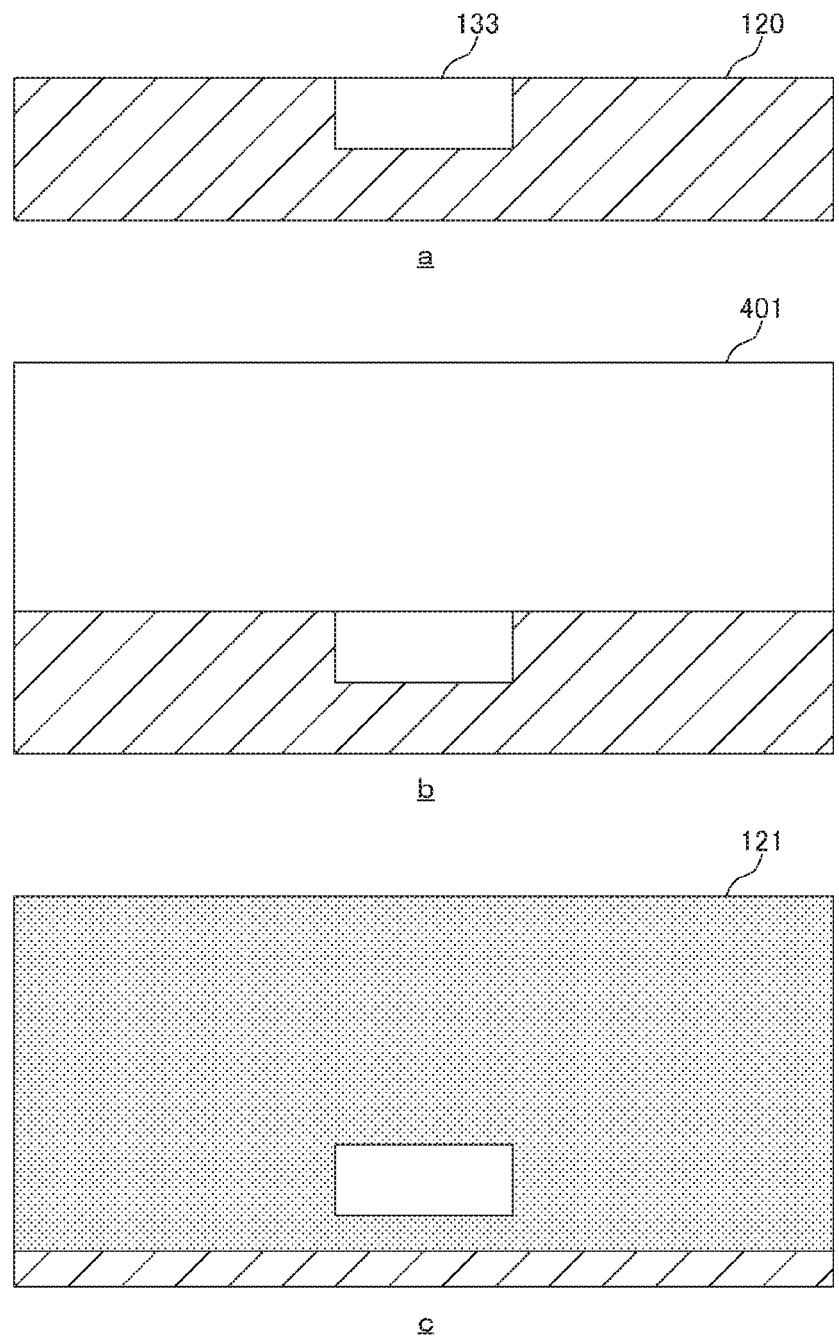
FIG. 5 illustrates an example of a method of manufacturing the imaging device according to the first embodiment of the present disclosure.
Figure 6:
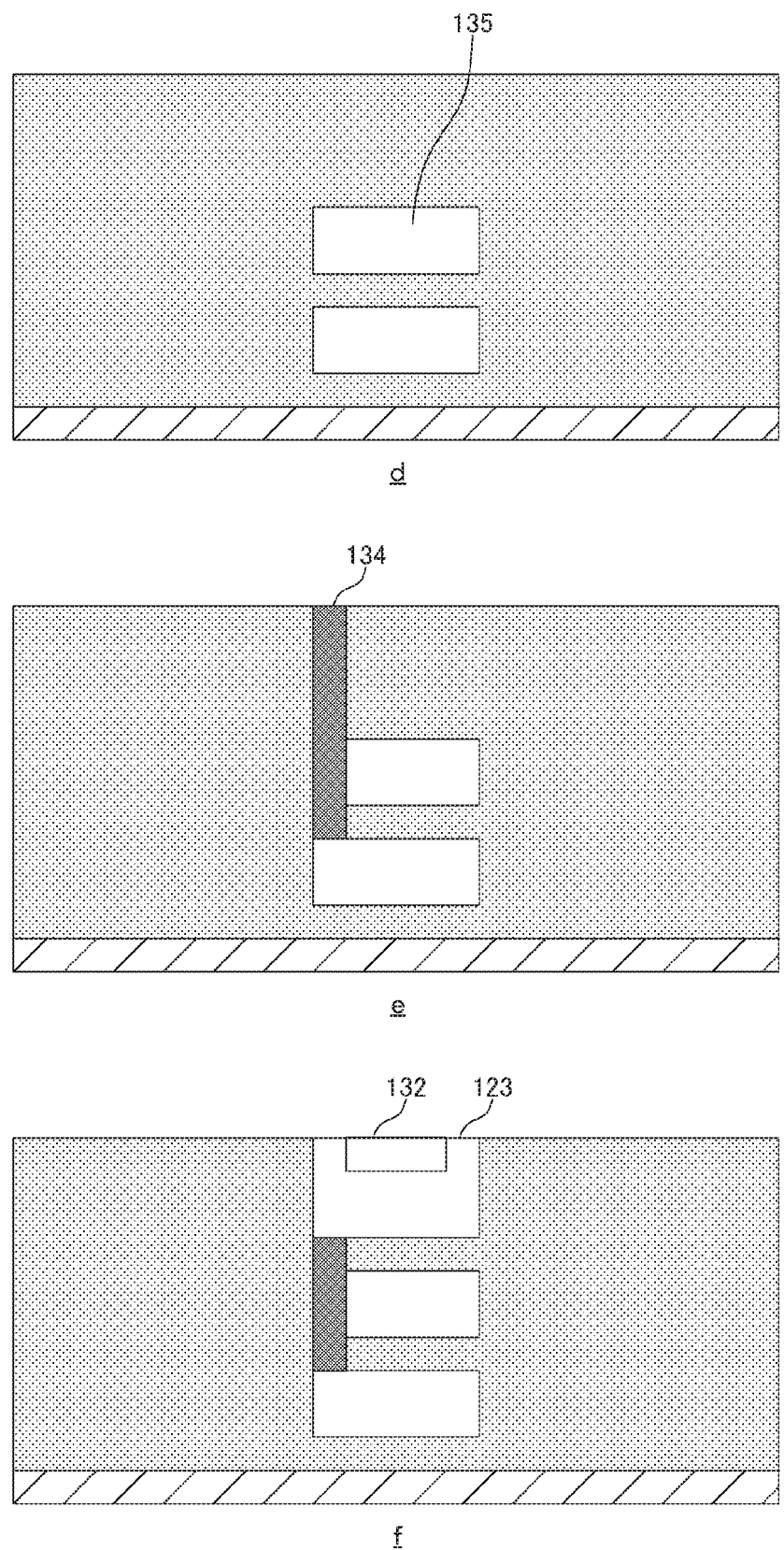
FIG. 6 illustrates the example of the method of manufacturing the imaging device according to the first embodiment of the present disclosure.
Figure 7:
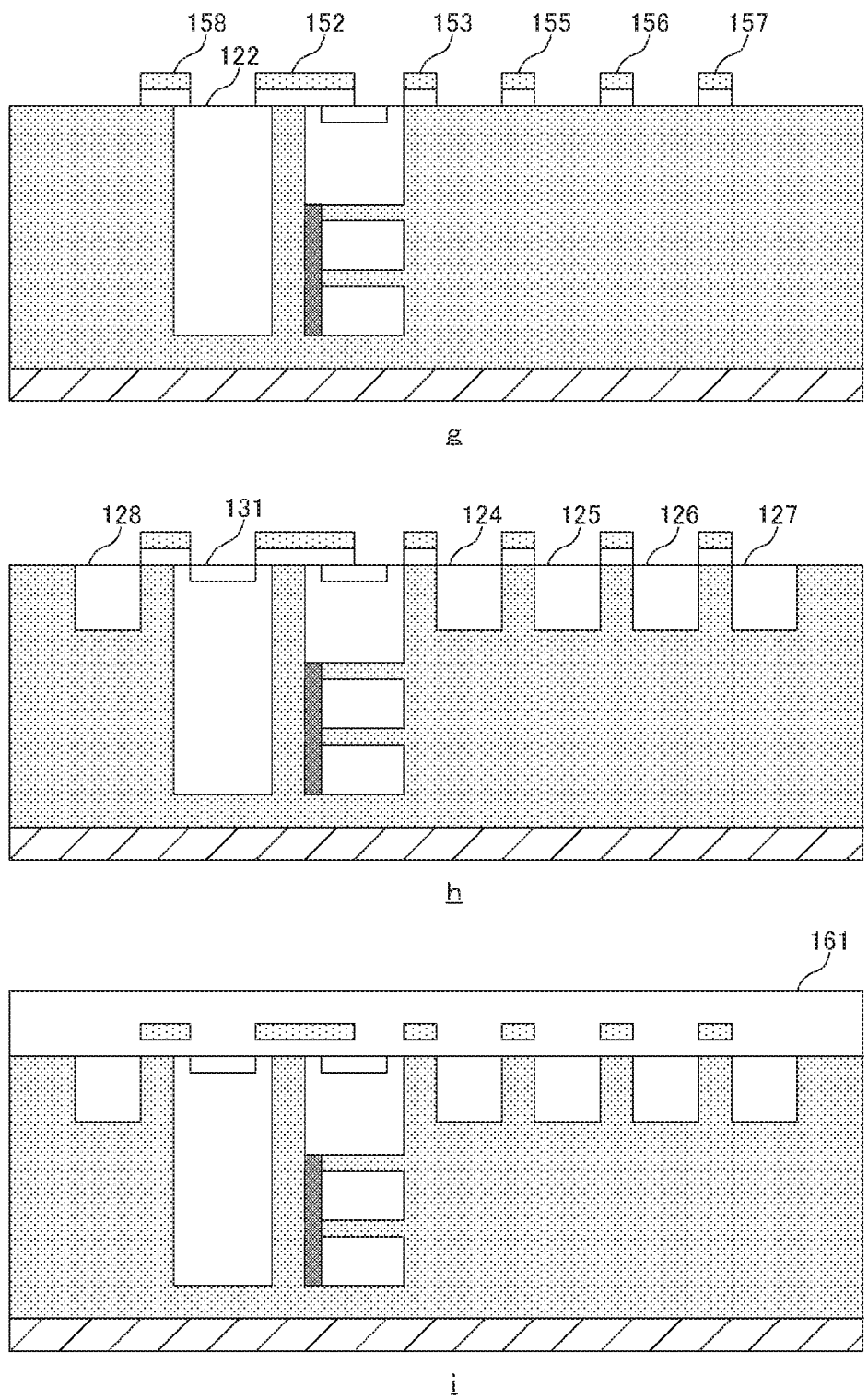
FIG. 7 illustrates the example of the method of manufacturing the imaging device according to the first embodiment of the present disclosure.

[Method of Manufacturing Imaging Device]
FIGS. 5 to 7 illustrate an example of a method of manufacturing an imaging device according to the first embodiment of the present disclosure. FIGS. 5 to 7 illustrate a process of manufacturing the imaging device 1.

First, the n-type semiconductor region 133 of the auxiliary charge holding section 111 is formed on a front surface of a semiconductor substrate 120. This can be formed by ion implantation (a of FIG. 5). This makes it possible to form the auxiliary charge holding section 111. This process corresponds to forming an auxiliary charge holding section according to an embodiment of the present disclosure.

Next, a semiconductor layer 401 is formed on the front surface of the semiconductor substrate 120 by epitaxial growth (b of FIG. 5).

Next, a p-type well region (the semiconductor substrate 121 in FIG. 2) is formed in the semiconductor substrate 120. This can be performed by ion implantation (c of FIG. 5).

Next, the p-type semiconductor region 135 described with reference to FIG. 4 is formed to lie above the n-type semiconductor region 133. This can be performed by ion implantation (d of FIG. 6).

Next, the n-type semiconductor region 134 of the transfer route 112 is formed to have a depth extending up to the n-type semiconductor region 133 from the front surface of the semiconductor substrate 120. This can be performed by ion implantation. This makes it possible to form the transfer route 112 (e of FIG. 6). This process corresponds to forming a transfer route according to an embodiment of the present disclosure.

Next, the n-type semiconductor region 123 of the first charge holding section 103 is formed to lie above the n-type semiconductor region 133 such that the n-type semiconductor region 123 overlaps the n-type semiconductor region 134. This can be performed by ion implantation. At this point, the ion implantation is performed in the same amount of dose as that for the n-type semiconductor region 133 of the auxiliary charge holding section 111. Next, the p-type semiconductor region 132 is formed by ion implantation. This makes it possible to form the first charge holding section 103 (f of FIG. 6). This process corresponds to forming a first charge holding section according to an embodiment of the present disclosure.

Next, the n-type semiconductor region 122 of the photoelectric converter 101 is formed by ion implantation. Thereafter, a gate oxide film is formed, and the gates 158, 152, 153, 155, 156, and 157 are formed. Note that the gate 158 and the like may be made of, for example, polysilicon, and may be formed using, for example, chemical vapor deposition (CVD) (g of FIG. 7). Next, the p-type semiconductor region 131 is formed. This makes it possible to form the photoelectric converter 101. This process corresponds to forming a photoelectric converter according to an embodiment of the present disclosure.

Next, the n-type semiconductor regions 128, 124, 125, 126, and 127 are formed. This can be performed by ion implantation (h of FIG. 7). Next, the insulation layer 161 is formed on the front surface of the semiconductor substrate 120, and a wiring layer (not illustrated) is formed. This makes it possible to form the first charge transfer section 102, the second charge transfer section 104, the second charge holding section 109, the charge draining section 108, and the MOS transistors 105 to 107 (i of FIG. 7). This process corresponds to forming a first charge transfer section and forming an image signal generator according to an embodiment of the present disclosure.

Thereafter, a back surface of the semiconductor substrate 120 is ground to be thin, and the separation region 141, the light-blocking film 142, the color filter 171, the on-chip lens 172, and the like are formed. The processes described above make it possible to manufacture the imaging device 1.

As described above, in the imaging device 1 of the first embodiment of the present disclosure, the auxiliary charge holding section 111 is arranged to underlie the first charge holding section 103 in the semiconductor substrate 121, and holds a portion of charges generated by the photoelectric converter 101. This makes it possible to increase, upon performing imaging using the global shutter method, the capacity of a holding section that temporarily holds a charge generated by performing photoelectric conversion, while preventing an increase in the footprint of the holding section.

2. Second Embodiment

The imaging device 1 of the first embodiment described above uses the transfer route 112 formed of an n-type semiconductor region. On the other hand, the imaging device 1 of a second embodiment of the present disclosure is different from the first embodiment described above in using a vertical gate electrode.

[Configuration of Transfer Route]

Figure 8:
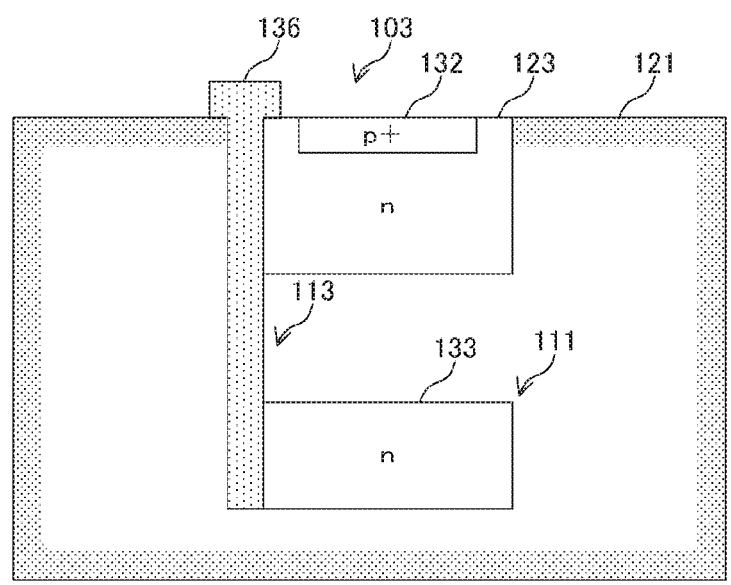
FIG. 8 is a cross-sectional view illustrating a configuration example of a transfer route according to a second embodiment of the present disclosure.

FIG. 8 is a cross-sectional view illustrating a configuration example of a transfer route according to the second embodiment of the present disclosure. The figure is a cross-sectional view illustrating a configuration example of a transfer route 113. The transfer route 113 in the figure is different from the transfer route 112 described with reference to FIG. 2 in being formed of a vertical gate electrode 136 and a p-type well region adjacent to the vertical gate electrode 136.

The vertical gate electrode 136 is a gate that is vertically formed from the front surface of the semiconductor substrate 121. The vertical gate electrode 136 is formed adjacent to the n-type semiconductor region 123 of the first charge holding section 103 and the n-type semiconductor region 133 of the auxiliary charge holding section 111, and is arranged between the n-type semiconductor regions 123 and 133. When an ON-voltage is applied to the vertical gate electrode 136, a channel region is formed in a p-type well region between the n-type semiconductor regions 123 and 133, and this makes it possible to move a charge between the first charge holding section 103 and the auxiliary charge holding section 111.

Except for the points described above, the imaging device 1 has a configuration similar to the configuration of the imaging device 1 described in the first embodiment of the present disclosure. Thus, the description is omitted.

As described above, in the imaging device 1 of the second embodiment of the present disclosure, it is possible to transfer a charge between the first charge holding section 103 and the auxiliary charge holding section 111 using the transfer route 113 including the vertical gate electrode 136.

3. Third Embodiment

The imaging device 1 of the first embodiment described above uses the auxiliary charge holding section 111 formed of the n-type semiconductor region 133 having a rectangular shape. On the other hand, the imaging device 1 of a third embodiment of the present disclosure is different from the first embodiment described above in using an auxiliary charge holding section formed of the n-type semiconductor region 133 of which the shape has been changed.

[Configuration of Auxiliary Charge Holding Section]

Figure 9:
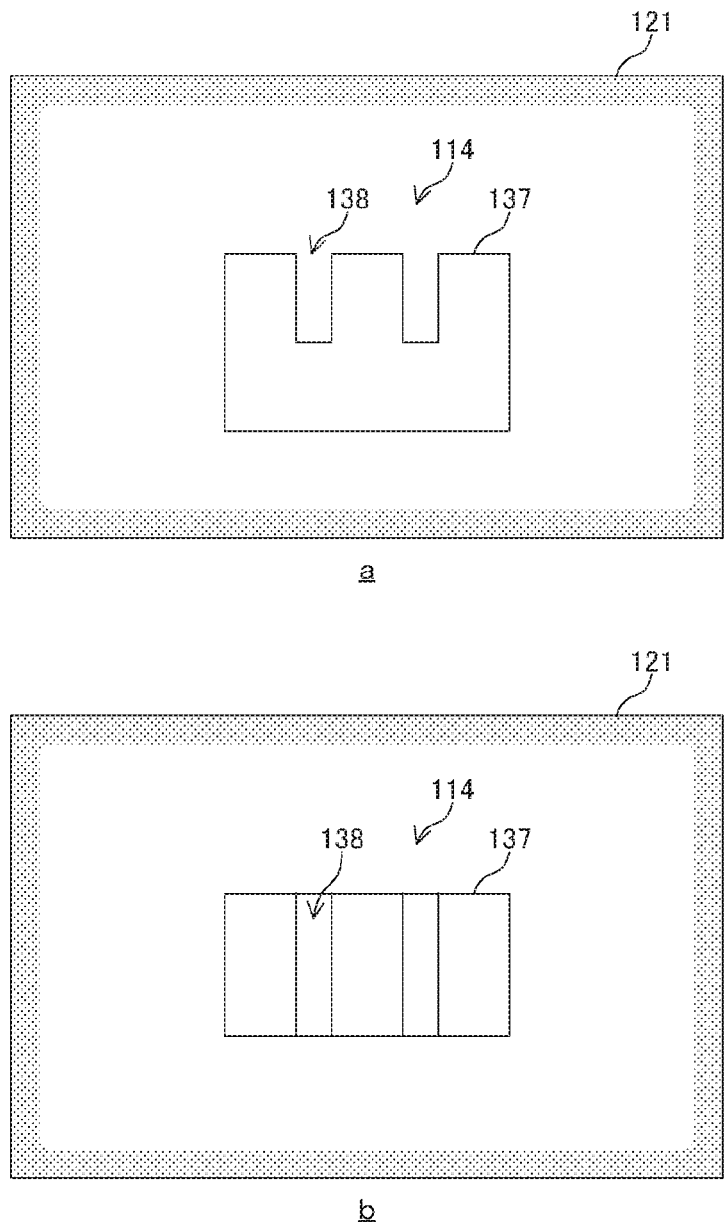
FIG. 9 is a cross-sectional view illustrating a configuration example of an auxiliary charge holding section according to a third embodiment of the present disclosure.

FIG. 9 is a cross-sectional view illustrating a configuration example of an auxiliary charge holding section according to the third embodiment of the present disclosure. The figure is a cross-sectional view illustrating a configuration example of an auxiliary charge holding section 114. The auxiliary charge holding section 114 in the figure is formed of an n-type semiconductor region 137 in which a concave 138 is formed. a of the figure illustrates an example in which the concave 138 is formed in a direction perpendicular to the front surface of the semiconductor substrate 121, and b of the figure illustrates an example in which the concave 138 is formed in a direction parallel to the front surface of the semiconductor substrate 121. The formation of the concave 138 makes it possible to increase the area of an interface between the n-type semiconductor region 137 and a p-type well region, and thus to increase the capacity for holding a charge.

Note that the configuration of the imaging device 1 is not limited to this example. For example, the n-type semiconductor region 137 may also have a shape obtained by turning the n-type semiconductor region 137 of a of FIG. 9 upside down.

Except for the points described above, the imaging device 1 has a configuration similar to the configuration of the imaging device 1 described in the first embodiment of the present disclosure. Thus, the description is omitted.

As described above, in the imaging device 1 of the third embodiment of the present disclosure, the formation of the concave 138 in the n-type semiconductor region 137 forming the auxiliary charge holding section 114 makes it possible to increase the holding capacity of the auxiliary charge holding section 114.

4. Example of Application to Camera

The technology according to the present disclosure (the present technology) is applicable to various products. For example, the present technology may be implemented as an imaging device included in an image-capturing apparatus such as a camera.

Figure 10:
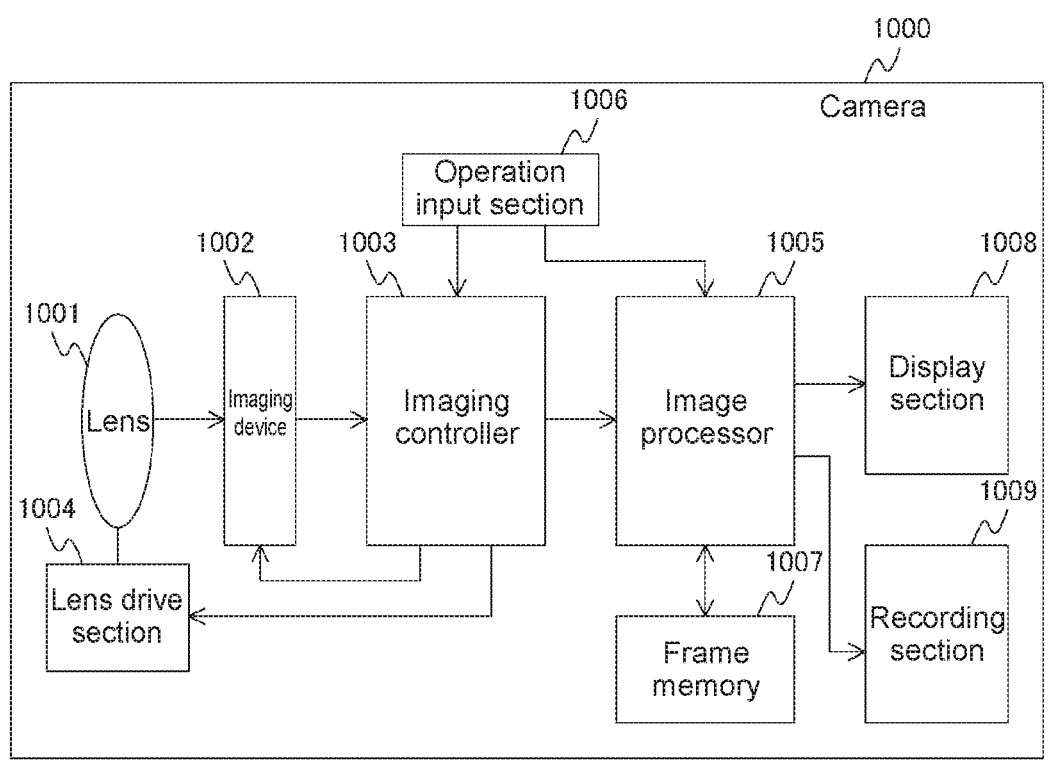
FIG. 10 is a block diagram illustrating an example of a schematic configuration of a camera that is an example of an image-capturing apparatus to which the present disclosure may be applied.

FIG. 10 is a block diagram illustrating an example of a schematic configuration of a camera that is an example of an image-capturing apparatus to which the present technology may be applied. A camera 1000 in the figure includes a lens 1001, an imaging device 1002, an imaging controller 1003, a lens drive section 1004, an image processor 1005, an operation input section 1006, a frame memory 1007, a display section 1008, and a recording section 1009.

The lens 1001 is an imaging lens of the camera 1000. The lens 1001 collects light from a subject, and causes the collected light to enter the imaging device 1002 described later to form an image of the subject.

The imaging device 1002 is a semiconductor device that images the light from the subject that is collected by the lens 1001. The imaging device 1002 generates an analog image signal depending on irradiated light, converts the analog image signal into a digital image signal, and outputs the digital image signal.

The imaging controller 1003 controls imaging performed by the imaging device 1002. The imaging controller 1003 performs control of the imaging device 1002 by generating a control signal and outputting the control signal to the imaging device 1002. Further, the imaging controller 1003 is capable of performing autofocusing in the camera 1000 on the basis of the image signal output from the imaging device 1002. Here, the autofocusing is a system that detects a focal position of the lens 1001 and automatically adjusts the focal position. It is possible to use, as the autofocusing, a method of detecting a focal position by detecting an image-plane phase difference using a phase difference pixel arranged in the imaging device 1002 (image-plane-phase-difference autofocusing). Further, it is also possible to apply a method of detecting, as the focal position, a position in which an image exhibits a highest contrast (contrast autofocusing). The imaging controller 1003 adjusts the position of the lens 1001 through the lens drive section 1004 on the basis of the detected focal position, and performs autofocusing. Note that the imaging controller 1003 can be implemented by, for example, a digital signal processor (DSP) that includes firmware.

The lens drive section 1004 drives the lens 1001 on the basis of control performed by the imaging controller 1003. The lens drive section 1004 is capable of driving the lens 1001 by changing the position of the lens 1001 using a built-in motor.

The image processor 1005 processes the image signal generated by the imaging device 1002. Examples of the processing include demosaicking that generates an image signal of a missing color from among image signals for respective pixels that respectively correspond to red, green, and blue; noise reduction that removes noise from an image signal; and encoding of an image signal. The image processor 1005 can be implemented by, for example, a microcomputer that includes firmware.

The operation input section 1006 receives an operation input from a user of the camera 1000. For example, it is possible to use a push button or a touch panel as the operation input section 1006. An operation input received by the operation input section 1006 is transmitted to the imaging controller 1003 and the image processor 1005. Thereafter, a process corresponding to the operation input such as a process of capturing an image of a subject, is started.

The frame memory 1007 is a memory that stores therein a frame that is an image signal for a single screen. The frame memory 1007 is controlled by the image processor 1005, and holds a frame in the process of image processing.

The display section 1008 displays thereon an image processed by the image processor 1005. For example, it is possible to use a liquid crystal panel for the display section 1008.

The recording section 1009 records therein an image processed by the image processor 1005. For example, it is possible to use a memory card or a hard disk as the recording section 1009.

The camera to which the present disclosure may be applied has been described above. The present technology may be applied to the imaging device 1002 from among the components described above. Specifically, the imaging device 1 described with reference to FIG. 1 is applicable to the imaging device 1002. A high-resolution imaging device obtained by applying the imaging device 1 to the imaging device 1002 makes it possible to perform imaging using the global shutter method.

Note that, although a camera has been described as an example, the technology according to the present disclosure may also be applied to, for example, a monitoring apparatus.

Finally, the descriptions of the respective embodiments above are examples of the present disclosure, and the present disclosure is not limited to the embodiments described above. Thus, various modifications may of course be made depending on the design and the like without departing from the technical idea according to the present disclosure even in the case of an embodiment other than the embodiments described above.

Note that the present technology may also take the following configurations.

(1) An imaging device, including:
a photoelectric converter that generates a charge depending on incident light;
a first charge holding section that is formed near a front surface of a semiconductor substrate, and holds the charge;
a first charge transfer section that transfers the charge from the photoelectric converter to the first charge holding section;
an auxiliary charge holding section that is formed to underlie the first charge holding section in the semiconductor substrate, and holds a portion of the charges held in the first charge holding section;
a transfer route that is a route used to transfer the charge between the first charge holding section and the auxiliary charge holding section; and
an image signal generator that generates an image signal on the basis of the charges held in the first charge holding section and the auxiliary charge holding section.

(2) The imaging device according to (1), in which
the auxiliary charge holding section has the same conductivity type as the first charge holding section, and
a semiconductor region of a conductivity type different from the conductivity type of the first charge holding section is arranged between the auxiliary charge holding section and the first charge holding section.

(3) The imaging device according to (1) or (2), in which
the transfer route is formed of a semiconductor region of the same conductivity type as the first charge holding section and the auxiliary charge holding section.

(4) The imaging device according to (1) or (2), in which
the transfer route is formed of a vertical gate electrode and the semiconductor substrate near the vertical gate electrode, the vertical gate electrode being arranged between the first charge holding section and the auxiliary charge holding section.

(5) The imaging device according to any one of (1) to (4), further including:
a second charge holding section that holds the charge; and
a second charge transfer section that transfers the charge from the first charge holding section and the auxiliary charge holding section to the second charge holding section, in which
the image signal generator generates an image signal on the basis of the charge held in the second charge holding section.

(6) A method of manufacturing an imaging device, the method including:
forming an auxiliary charge holding section such that the auxiliary charge holding section underlies a first charge holding section in a semiconductor substrate, the first charge holding section holds a charge generated by a photoelectric converter that generates the charge depending on incident light, the auxiliary charge holding section holding a portion of the held charges;
forming a transfer route that is a route used to transfer the charge between the first charge holding section and the auxiliary charge holding section;
forming the first charge holding section in the semiconductor substrate;
forming the photoelectric converter;
forming a first charge transfer section that transfers the charge from the photoelectric converter to the first charge holding section; and
forming an image signal generator that generates an image signal on the basis of the charges held in the first charge holding section and the auxiliary charge holding section.

REFERENCE SIGNS LIST

1 imaging device
10 pixel array
100 pixel
101 photoelectric converter
102 first charge transfer section
103 first charge holding section
104 second charge transfer section
105 to 107 MOS transistor
108 charge draining section
109 second charge holding section
111, 114 auxiliary charge holding section
112, 113 transfer route 120, 121 semiconductor substrate
122 to 128, 133, 134, 137 n-type semiconductor region
131, 132, 135 p-type semiconductor region
136 vertical gate electrode
1002 imaging device

What is claimed is:

1. An imaging device, comprising:
a photoelectric converter that generates a charge depending on incident light;
a first charge holding section that is formed near a front surface of a semiconductor substrate, and holds the charge;
a first charge transfer section that transfers the charge from the photoelectric converter to the first charge holding section;
an auxiliary charge holding section that is formed to underlie the first charge holding section in the semiconductor substrate, and holds a portion of the charges held in the first charge holding section;
a transfer route that transfers the charge between the first charge holding section and the auxiliary charge holding section; and
an image signal generator that generates an image signal based on the charges held in the first charge holding section and the auxiliary charge holding section,
wherein semiconductor regions of each of the first charge holding section and the auxiliary charge holding section have a higher impurity concentration than an impurity concentration of a semiconductor region of the photoelectric converter.

2. The imaging device according to claim 1,
wherein the auxiliary charge holding section has a same conductivity type as the first charge holding section, and
wherein a semiconductor region of a conductivity type different from a conductivity type of the first charge holding section is arranged between the auxiliary charge holding section and the first charge holding section.

3. The imaging device according to claim 1, wherein the transfer route is formed of a semiconductor region of mea same conductivity type as the first charge holding section and the auxiliary charge holding section.

4. The imaging device according to claim 1, wherein the transfer route is formed of a vertical gate electrode and the semiconductor substrate near the vertical gate electrode, the vertical gate electrode being arranged between the first charge holding section and the auxiliary charge holding section.

5. The imaging device according to claim 1, further comprising:
a second charge holding section that holds the charge; and
a second charge transfer section that transfers the charge from the first charge holding section and the auxiliary charge holding section to the second charge holding section,
wherein the image signal generator generates an image signal based on a basis of the charge held in the second charge holding section.

6. The imaging device according to claim 1, wherein the charge transferred by the first charge transfer section moves bidirectionally between the first charge holding section and the auxiliary charge holding section.

7. The imaging device according to claim 1, wherein the auxiliary charge holding section includes concave portions formed in a direction parallel to a front surface of the semiconductor substrate.

8. The imaging device according to claim 1, wherein the auxiliary charge holding section includes concave portions formed in a direction perpendicular to a front surface of the semiconductor substrate.

9. The imaging device according to claim 4, wherein the vertical electrode is provided adjacent to and in contact with one side portion of each of the first charge holding section and the auxiliary charge holding section, aligned along the one side portion of each of the first charge holding section and the auxiliary charge holding section.

10. The imaging device according to claim 5, further comprising a separation region that prevents movement of a charge between the photoelectric converter and the first charge holding section and between the photoelectric converter and the second charge holding section.

11. An electronic apparatus, comprising:
an optical system;
an imaging device that receives light from the optical system, the imaging device, comprising:
a photoelectric converter that generates a charge depending on incident light;
a first charge holding section that is formed near a front surface of a semiconductor substrate, and holds the charge;
a first charge transfer section that transfers the charge from the photoelectric converter to the first charge holding section;
an auxiliary charge holding section that is formed to underlie the first charge holding section in the semiconductor substrate, and holds a portion of the charges held in the first charge holding section;
a transfer route that transfers the charge between the first charge holding section and the auxiliary charge holding section; and
an image signal generator that generates an image signal based on the charges held in the first charge holding section and the auxiliary charge holding section; and
a digital signal processor that processes signals received from the imaging device,
wherein semiconductor regions of each of the first charge holding section and the auxiliary charge holding section have a higher impurity concentration than an impurity concentration of a semiconductor region of the photoelectric converter.

12. The electronic apparatus according to claim 11, wherein
the auxiliary charge holding section has a same conductivity type as the first charge holding section, and
a semiconductor region of a conductivity type different from a conductivity type of the first charge holding section is arranged between the auxiliary charge holding section and the first charge holding section.

13. The electronic apparatus according to claim 11, wherein
the transfer route is formed of a semiconductor region of a same conductivity type as the first charge holding section and the auxiliary charge holding section.

14. The electronic apparatus according to claim 11, wherein
the transfer route is formed of a vertical gate electrode and the semiconductor substrate near the vertical gate electrode, the vertical gate electrode being arranged between the first charge holding section and the auxiliary charge holding section.

15. The electronic apparatus according to claim 11, further comprising:
- a second charge holding section that holds the charge; and
- a second charge transfer section that transfers the charge from the first charge holding section and the auxiliary charge holding section to the second charge holding section, wherein
- the image signal generator generates an image signal based on the charge held in the second charge holding section.

16. The electronic apparatus according to claim 11, wherein the charge transferred by the first charge transfer section moves bidirectionally between the first charge holding section and the auxiliary charge holding section.

17. The electronic apparatus according to claim 11, wherein the auxiliary charge holding section includes concave portions formed in a direction parallel to a front surface of the semiconductor substrate.

18. The electronic apparatus according to claim 11, wherein the auxiliary charge holding section includes concave portions formed in a direction perpendicular to a front surface of the semiconductor substrate.

19. The electronic apparatus according to claim 14, wherein the vertical electrode is provided adjacent to and in contact with one side portion of each of the first charge holding section and the auxiliary charge holding section, aligned along the one side portion of each of the first charge holding section and the auxiliary charge holding section.

* * * * *